(12) United States Patent
Hughes

(10) Patent No.: US 7,265,609 B2
(45) Date of Patent: Sep. 4, 2007

(54) TRANSCONDUCTOR CIRCUITS

(75) Inventor: John B. Hughes, Hove (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/557,346

(22) PCT Filed: May 14, 2004

(86) PCT No.: PCT/IB2004/001699

§ 371 (c)(1),
(2), (4) Date: Nov. 21, 2005

(87) PCT Pub. No.: WO2004/105234

PCT Pub. Date: Dec. 2, 2004

(65) Prior Publication Data

US 2006/0250180 A1   Nov. 9, 2006

(30) Foreign Application Priority Data

May 23, 2003 (GB) ................. 0311906.2

(51) Int. Cl.
*H03K 5/00* (2006.01)
(52) U.S. Cl. ..................... 327/553; 327/552
(58) Field of Classification Search ......... 327/551–559
See application file for complete search history.

(56) References Cited

U.S. PATENT DOCUMENTS 5,990,737 A * 11/1999 Czarnul et al. ............ 330/69
6,317,016 B1 11/2001 Kuo
6,404,308 B1 6/2002 Mattisson
6,407,658 B2 6/2002 Kuo
6,490,706 B2 12/2002 Mattisson
6,680,627 B2 1/2004 Hughes
7,042,291 B2 * 5/2006 Ueno et al. ............... 330/258
2002/0153973 A1 10/2002 Alott
2003/0080786 A1 * 5/2003 Hughes ..................... 327/103

FOREIGN PATENT DOCUMENTS

EP      0362935 A2    4/1990

OTHER PUBLICATIONS

J.B. Huges et al, "1mW CMOS Polyphase Channel Filter for Bluetooth", IEE Proc. Circuits Devices Systems, vol. 149, No. 5/6, Dec. 1, 2002, pp. 348-354.

* cited by examiner

*Primary Examiner*—Dinh T. Le

(57) ABSTRACT

A transconductor circuit, such as a gyrator filter, comprises an arrangement of balanced class AB transconductors, capacitors and floating MOS resistors formed by MOS transistors operating in their triode region. Tuning of the filter is effected by varying a common supply rail voltage. The circuit includes a means for producing a voltage offset from the common mode voltage of the class AB transconductors. The offset voltage is supplied to a parallel arrangement of a class AB transconductor having a transconductance and the source-drain path of a MOS transistor emulating a MOS resistor. The current output of the parallel arrangement is integrated and supplied as a control voltage to the gate electrode of the MOS transistor. By loop action the control voltage is adjusted and supplied to the floating MOS resistors.

6 Claims, 5 Drawing Sheets

TRANSCONDUCTOR CIRCUITS

Figure 1:
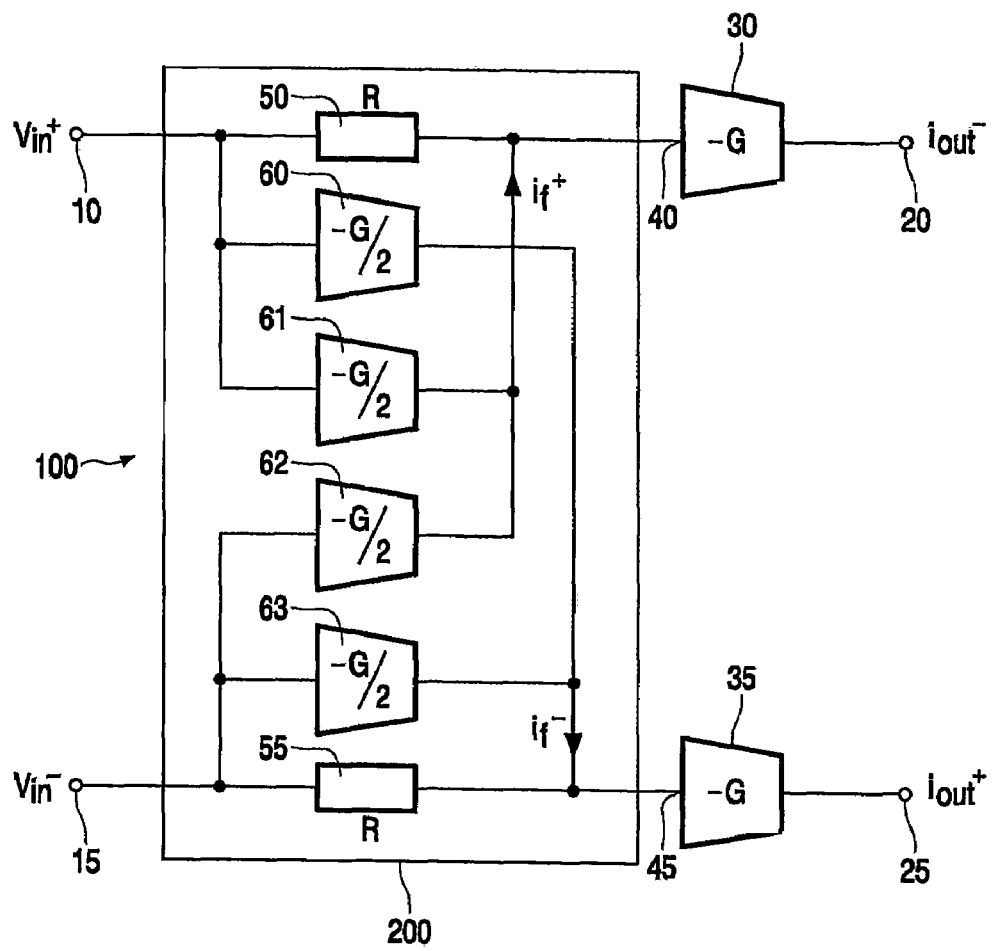

The present invention relates to improvements in or relating to transconductor circuits. Such circuits have applications in gyrator filters, amplifiers and the like which are used in devices, such as transceivers.

For convenience of description the present invention will be described with reference to the use of transconductor circuits in filters, such as ladder filters. However examples of other applications will be given.

Balanced class AB transconductors have been successfully used in gyrator channel filters for modern wireless transceivers, for example transceivers used in Bluetooth™ and Zigbee systems. An example of such a balanced class AB transconductor is disclosed in FIG. 10 of U.S. Pat. No. 6,680,627B2, which figure comprises FIG. 1 of the accompanying drawings.

The illustrated balanced class AB transconductor comprises a balanced transconductor 100 having first and second inputs 10, 15, first and second outputs 20, 25, and first and second main single-ended transconductors 30, 35 each having transconductance −G and coupled to supply current to the first and second outputs 20, 25 respectively. A common-mode feedback cancellation network 200 is coupled between the first and second inputs 10, 15 of the balanced transconductor 100 and inputs 40, 45 of the first and second main single-ended transconductors 30, 35.

The cancellation network 200 comprises a first resistor 50 of value R coupled between the first input 10 of the balanced transconductor 100 and the input 40 of the first main single-ended transconductor 30, and a second resistor 55 of value R coupled between the second input 15 of the balanced transconductor 100 and the input 45 of the second main single-ended transconductor 35. The cancellation network 200 further comprises four half-size single-ended transconductors 60, 61, 62, 63, each having transconductance −G/2. The half-size, single-ended transconductors 60, 61, 62, 63 use half-width transistors and draw half the supply current of the main single-ended transconductors 30, 35.

The input and output of the first half-size transconductor 60 are coupled respectively to the first input 10 of the balanced transconductor 100 and to the input 45 of the second main single-ended transconductor 35. The input and output of the second half-size transconductor 61 are coupled respectively to the first input 10 of the balanced transconductor 100 and to the input 40 of the first main single-ended transconductor 30. The input and output of the third half-size transconductor 62 are coupled respectively to the second input 15 of the balanced transconductor 100 and to the input 40 of the first main single-ended transconductor 30. The input and output of the fourth half-size transconductor 63 are coupled respectively to the second input 15 of the balanced transconductor 100 and to the input 45 of the second main single-ended transconductor 35.

The value R of the first and second resistors 50, 55 and the transconductance −G are related by the expression R=1/G. In the general case, the transconductance values of the cancellation network 200 may be expressed as −G'/2, and the value of R given by R=1/G'.

For convenience of understanding the operation of the illustrated circuit it will be assumed that the PMOS and NMOS transistors constituting the single ended transconductors have identical properties.

Operation of the balanced transconductor 100 is as follows. First, consider the balanced transconductor 100 under quiescent conditions in which the input signal voltages are $v_{in}^+ = v_{in}^- = V_{dda}/2$, where $V_{dda}$ is the common supply rail voltage. The current in each of the common-mode feedback MOS transistors of the half-size transconductors 60, 61, 62, 63 is J/2 and the feedback currents are $i_f^+ = i_f^- = 0$. As no current flows in the first and second resistors 50, 55, the voltages applied to the inputs 40, 45 of the first and second main single-ended transconductors 30, 35 are also $V_{dda}/2$ and the currents at the outputs 20, 25 of the balanced transconductor 100 are zero.

Next, consider the balanced transconductor 100 with a purely differential input signal voltage $v_{dm}$ i.e. the input voltages are $V_{in}^+ = V_{dda}/2 + v_{dm}/2$ and $v_{in}^- = V_{dda}/2 - v_{dm}/2$. The feedback currents are again $i_f^+ = i_f^- = 0$ because the half-size transconductors 60, 61 generate currents which are equal and opposite to the currents generated by the half-size transconductors 62, 63. The first and second resistors 50, 55 create no voltage drop, so the input voltages $v_{in}^+$ and $v_{in}^-$ are applied directly to the inputs 40, 45 respectively of the first and second main single-ended transconductors 30, 35 and a current of $v_{dm}$. G/2 flows at the balanced transconductor outputs 20, 25.

Now, consider the balanced transconductor 100 with a purely common-mode input signal voltage $V_{cm}$, i.e. the input voltages are $v_{in}^+ = v_{in}^- = V_{dda}/2 + V_{cm}$. The feedback currents are now $i_f^+ = i_f^- = V_{cm}$. G and they produce a voltage drop on the first and second resistors 50, 55 of $V_{cm}$ that subtracts from $v_{in}^+$ and $v_{in}^-$ so that the voltages at the inputs 40, 45 of the first and second main transconductors 30, 35 are $V_{dda}/2$ and the currents at the outputs 20, 25 of the balanced transconductor 100 are zero.

The resistors 50, 55 are termed floating resistors and are needed in the common mode feedback stages of these transconductors to produce common-mode rejection. Floating resistors are frequently required as filter components (for example as terminations of an active ladder filter) and usually this is achieved by using pairs of transconductors to emulate equivalent grounded resistors. However this approach consumes power and using actual resistors is preferable. In either case, whether used as actual filter components or in common-mode rejection circuits, the resistors' conductance values must closely track the filter's transconductance values despite spreads in processing or changes in temperature. A similar consideration applies in other applications such as amplifiers.

An object of the present invention is to enable floating resistors in transconductor circuits to track closely the circuit's transconductance values.

According to one aspect of the present invention there is provided a transconductor circuit comprising a transconductor coupled to a supply rail voltage source and at least one MOS resistor comprising a MOS transistor whose source-drain path is coupled to the transconductor, resistance tuning means coupled to the supply voltage rail and having an output for supplying a control voltage to a gate electrode of the MOS transistor, whereby the resistance value of the MOS resistor tracks changes in the transconductance of the transconductor due to tuning effected by altering the supply rail voltage.

The first aspect of the present invention also provides a transconductor circuit including a balanced transconductor comprising a first and a second single ended transconductors, each having an input and an output, MOS resistors respectively comprising MOS transistors having their source-drain paths coupled between respective first and second input terminals and the inputs of the first and second single ended transconductor, a differential transconductance coupled between the first and second input terminals and the inputs of the single ended transconductor, a source of a common supply rail voltage, and resistance tuning means coupled to the common supply rail voltage source for supplying a control voltage to gate electrodes of the MOS transistors for tuning the resistance of the MOS resistors.

According to a second aspect of the present invention there is provided a filter circuit including a balanced transconductor comprising a first and a second single ended transconductor means (30, 35), each having an input and an output, first and second MOS resistors respectively comprising first and second MOS transistors having their source-drain paths coupled between respective first and second input terminals and the inputs of the first and second single ended transconductor means, a differential transconductance coupled between the first and second input terminals and the inputs of the single ended transconductor means, and a source of a common supply rail voltage, frequency tuning means for tuning the filter by adjusting the common supply rail voltage and resistance tuning means coupled to the common supply rail voltage source for supplying a control voltage to gate electrodes of the first and second MOS transistors for tuning the resistance of the MOS resistors.

The present invention enables the conductance values of floating resistors formed by the first and second MOS transistors to be tuned simultaneously with the tuning of the transconductance values of the class AB transconductors employed in gyrator filters. In gyrator filters accurate filter responses are achieved automatically by tuning a reference filter to a reference frequency and, with gyrator filters employing class AB transconductors, this may be achieved by adjusting the common supply rail voltage to tune the transconductance values. In such arrangements, the transconductance values are adjusted to compensate for process tolerances and, during operation, to compensate for temperature and aging effects.

In an embodiment of the present invention the resistance tuning means comprises means coupled to the common supply rail voltage for deriving a voltage offset from the common mode voltage of the single ended transconductor means and means for deriving a control voltage from said offset voltage, which control voltage is applied to gate electrodes of the first and second MOS transistors.

The means for deriving a control voltage may comprises a control loop including a parallel connection of a third single ended transconductor means and the source-drain path a third MOS transistor and an integrating stage having an input coupled to an output of the parallel connection and an output coupled to the gate electrode of the third MOS transistor.

Amplifying means, for example an inverter, may couple an output of the integrating stage to the gate electrode of the third MOS transistor.

The means for deriving the offset voltage may comprise a fourth transconductor having a lower quiescent voltage relative to that of the first and second single ended transconductor means. This may be achieved by using PMOS and NMOS transistors with dissimilar properties to produce a quiescent input voltage≠$V_{dda}/2$.

The present invention further relates to an integrated circuit including a transconductor circuit made in accordance with the present invention and to an electronic device including a transconductor circuit made in accordance with the present invention.

Figure 3:
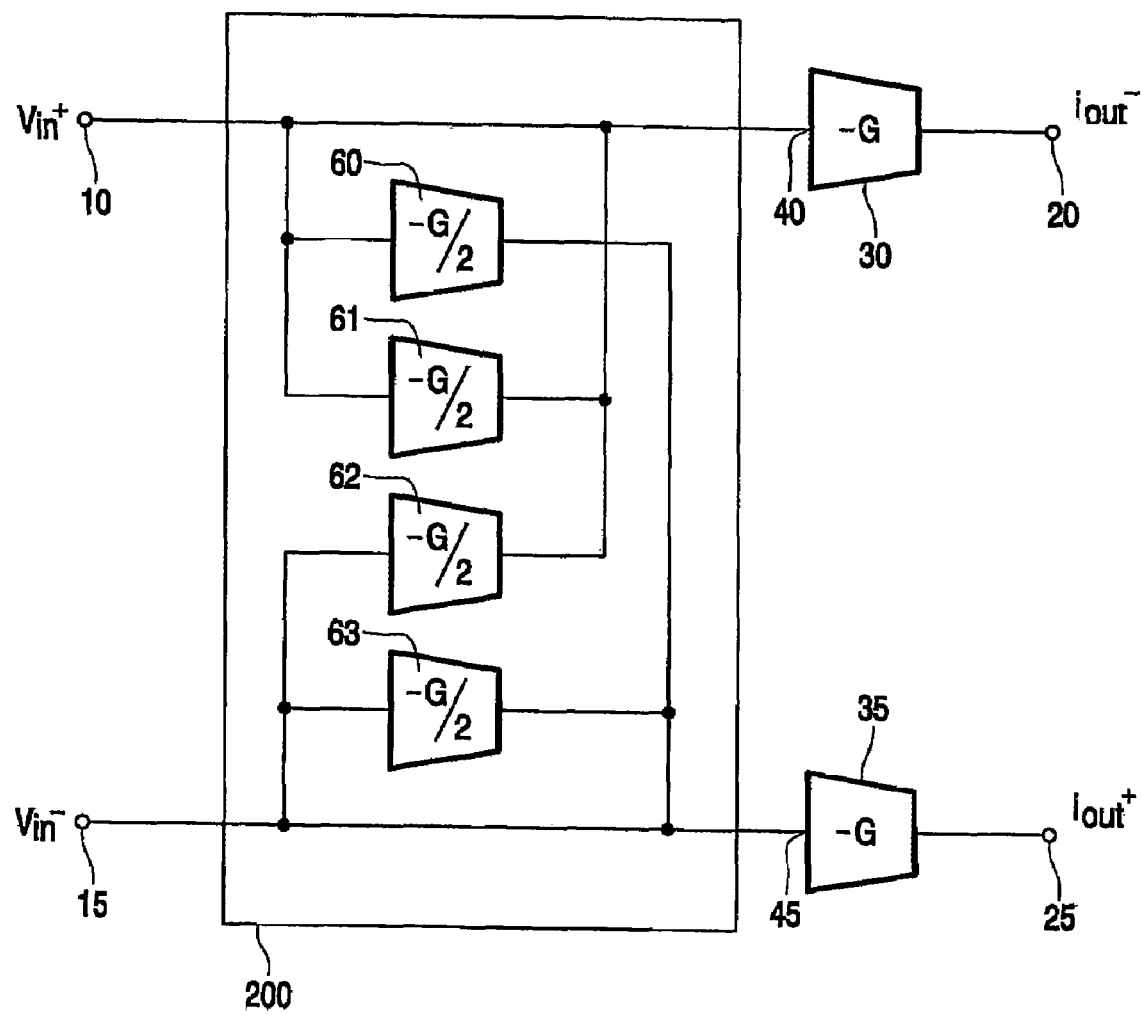
Figure 4:
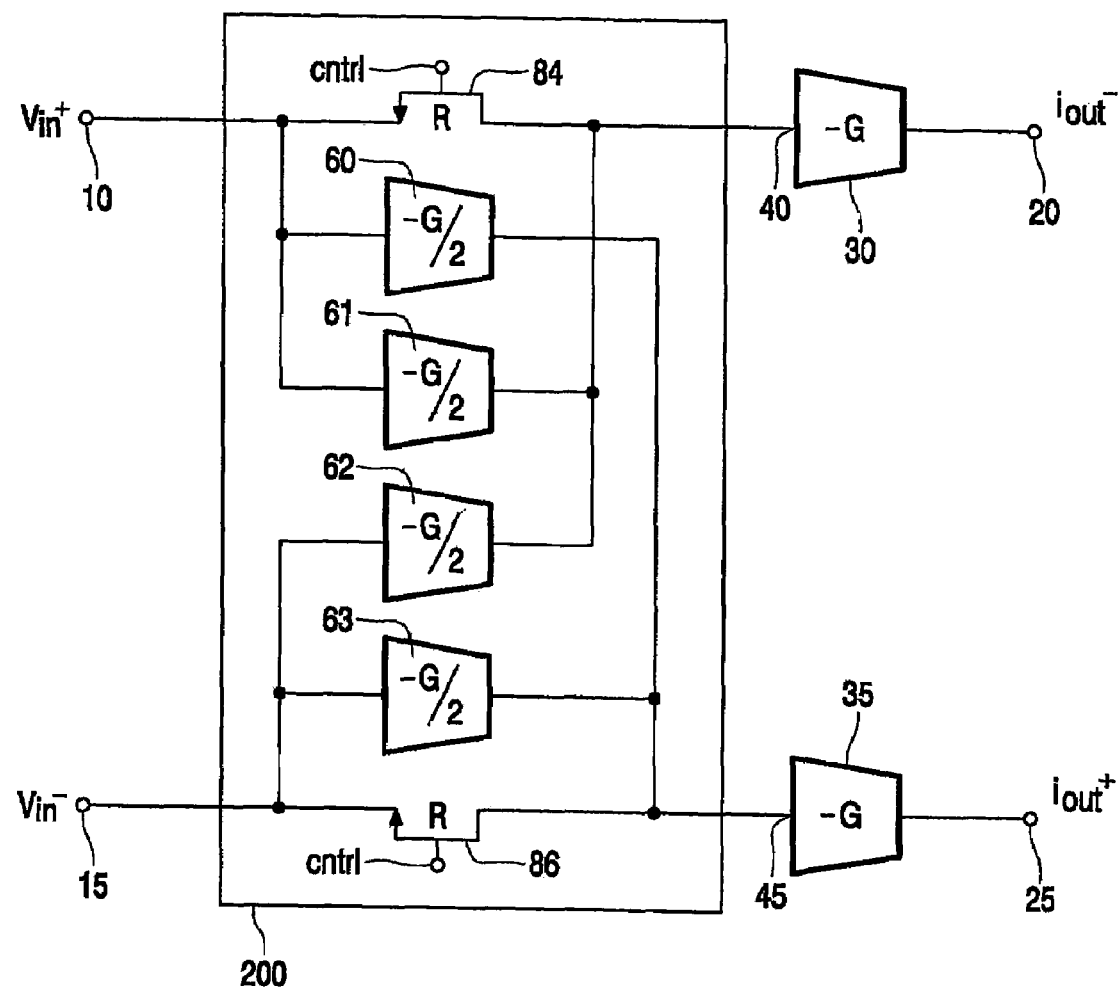
Figure 5:
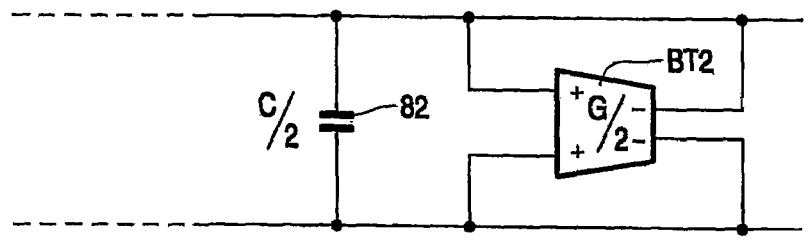
Figure 6:
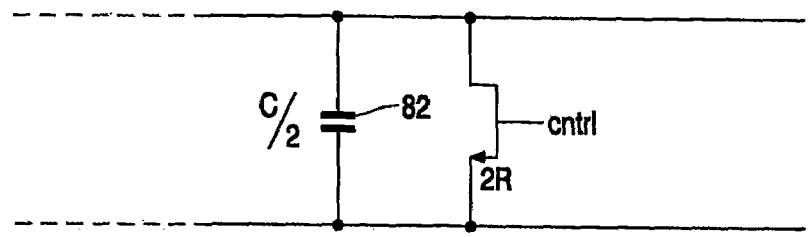
Figure 7:
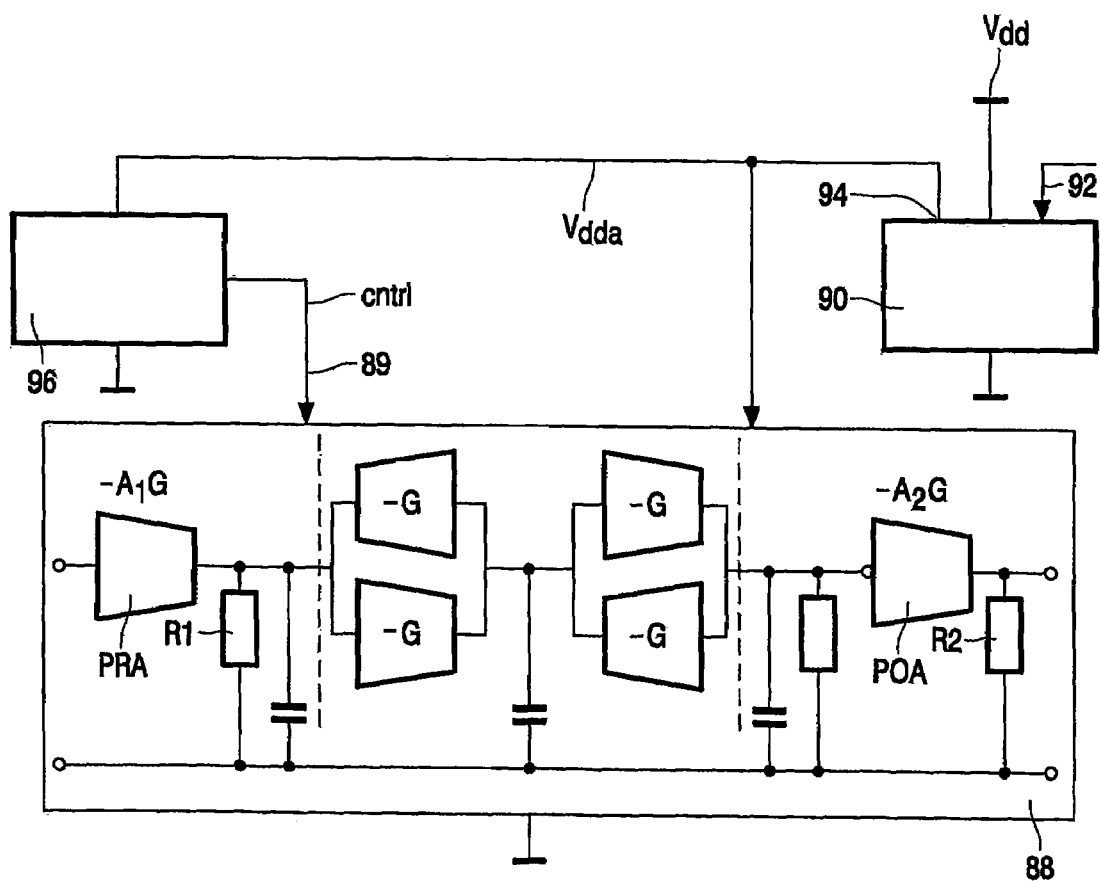
Figure 8:
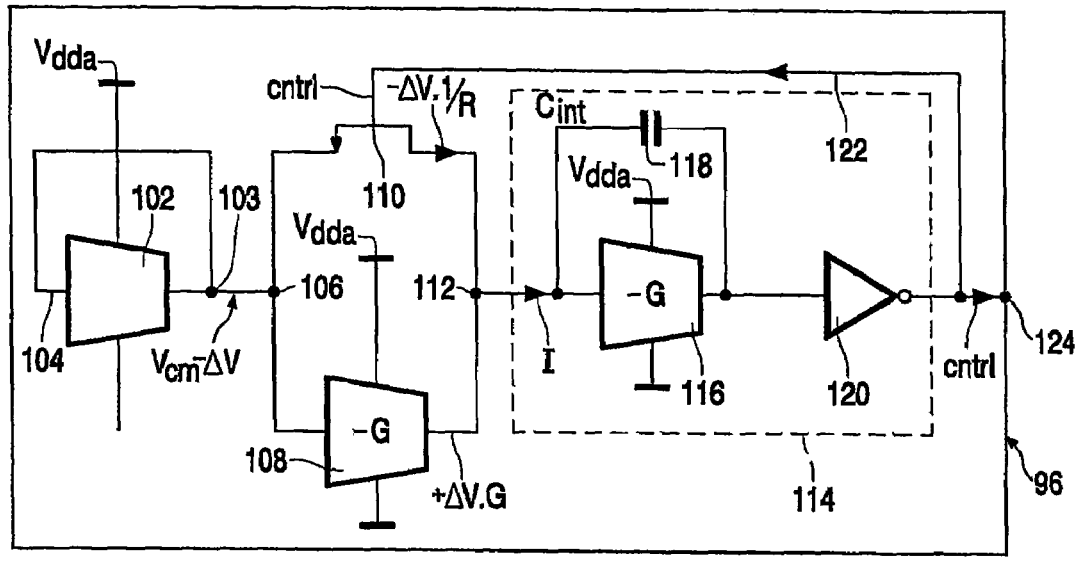
Figure 9:
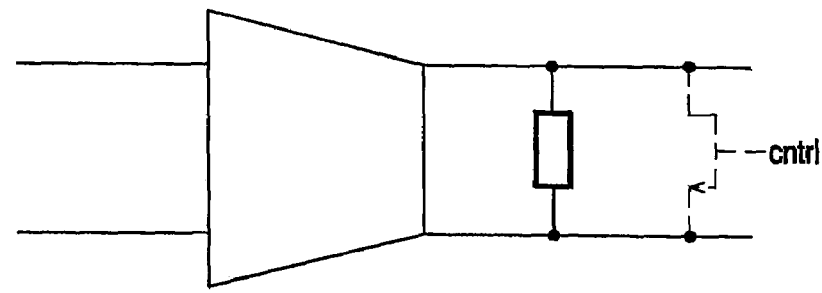
Figure 10:
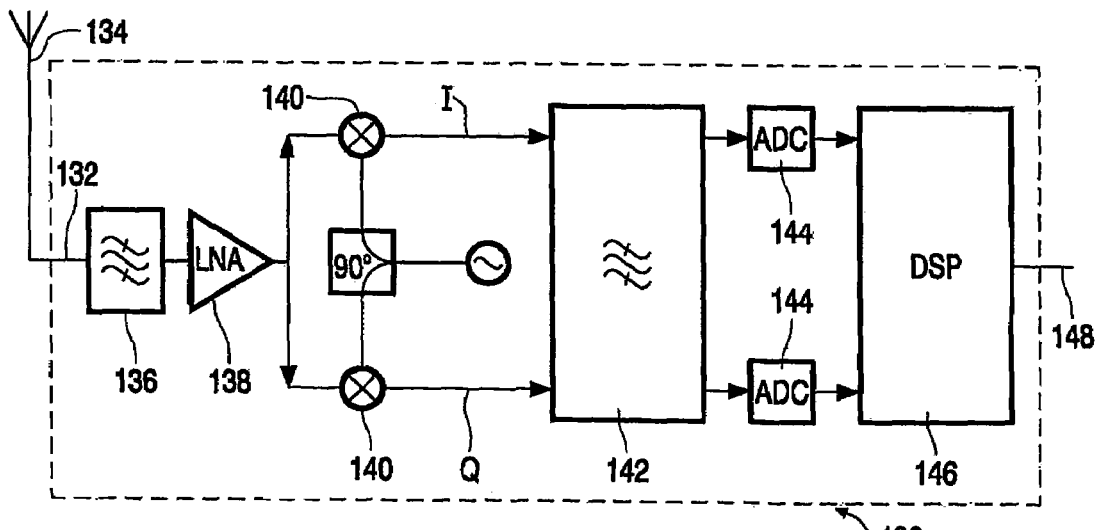

The present invention will now be described, by way of example, with reference to the accompanying drawings, wherein;

FIG. 1 is a block schematic diagram of a balanced transconductor as disclosed in FIG. 10 of U.S. Pat. No. 6,680,627B2, FIG. 2 is a schematic diagram of a single ended transconductor, FIG. 3 is a block schematic diagram of a balanced transconductor, FIG. 4 is a block schematic diagram of a balanced transconductor with common-mode rejection (cmr), FIG. 5 is a block schematic diagram of a balanced transconductor arrangement to obtain a parallel capacitance and resistance, FIG. 6 illustrates a parallel capacitance and resistance, the latter comprising a floating MOS resistor, FIG. 7 is a block schematic diagram of a transconductance tuning arrangement, FIG. 8 is a block schematic diagram of a resistance tuning circuit, FIG. 9 is a block schematic diagram of an amplifier comprising a single ended transconductor and a MOS resistor, and FIG. 10 is a block schematic diagram of a radio receiver including a gyrator filter made in accordance with the present invention.

In the drawings the same reference numerals have been used to indicate corresponding features.

Figure 2:
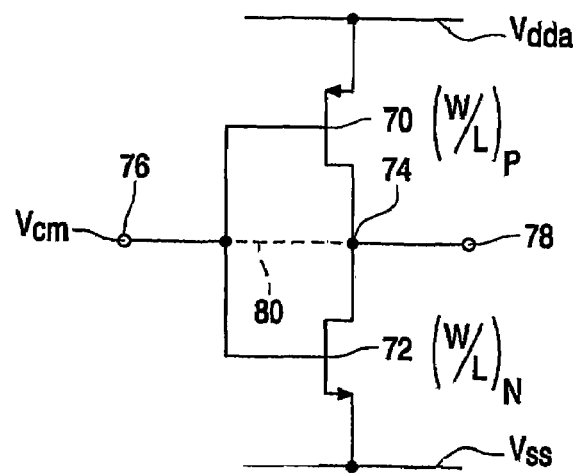

Referring to FIG. 2, the single ended transconductor comprises a PMOS transistor 70 and a NMOS transistor 72 whose drain electrodes are connected together at a junction 74. The common supply rail voltage line $V_{dda}$ is connected to the source electrode of the transistor 70 and a $V_{ss}$ supply line is connected to the source electrode of the transistor 72. Gate electrodes of the transistors 70, 72 are connected to a common input terminal 76. An output terminal 78 is connected to the junction 74. The illustrated transconductor has a transconductance −G and a quiescent input voltage $V_{cm}$ at which no current flows at the output terminal 78. Both the transconductance and the quiescent voltage are determined by the sizing, that is the width (W) length (L) ratios (W/L), and the value of $V_{dda}$.

If the input and output terminals 76, 78 are interconnected as shown by the broken line 80 then the transistors 70, 72 are diode connected and are equivalent to a resistor having a value R which equals 1/G connected in series with the quiescent input voltage $V_{cm}$ between the supply lines $V_{dda}$ and $V_{ss}$.

Referring to FIG. 3, the illustrated balanced transconductor is similar to FIG. 1 with the difference that the resistors 50, 55 (FIG. 1) are not present. In the interests of brevity FIG. 3 will not be described in detail. The balanced transconductor has a differential transconductance of G/2.

Referring to FIG. 4, the illustrated balanced transconductor with common-mode rejection is identical to FIG. 1 with the exception of that the resistors 50, 55 are implemented as NMOS transistors 84, 86 whose source-drain paths are connected between the terminals 10, 40 and 15, 45, respectively. A control voltage cntrl is supplied to the gate electrodes of the transistors 84, 86, which are operating in their triode regions, and is used to tune the resistance value. Common mode rejection is highest when the resistance R of the NMOS transistors 84, 86 is given by R=1/G and can be achieved by tuning the voltage cntrl on their gate electrodes. In the interests of brevity FIG. 4 will not be described in detail. A balanced transconductor with common-mode rejection can be used at the interfaces of a filter.

FIG. 5 illustrates a balanced transconductor BT2 having its respective outputs connected to its inputs to form a resistance. A capacitor 82 having a capacitance value C/2 is coupled across the inputs of the balanced transconductor BT2. The time constant of the illustrated circuit is G.C.

FIG. 6 illustrates a time constant circuit comprising a capacitor 82 having a value of C/2 and a MOS resistor consisting of a NMOS transistor having a gate electrode to which a tuning voltage cntrl is applied. If the MOS resistor is tuned to R=1/G, it produces the same time constant as in the FIG. 5 arrangement.

FIG. 7 illustrates a master-slave circuit which will enable the transconductance values and the resistance values, formed by the conductances of the NMOS transistors 84, 86 (hereinafter referred to as "MOS resistor(s)"), to be tuned simultaneously. In the drawing a filter 88, which is illustrated as an active ladder filter in which the prototype's inductance is modelled by a capacitor and gyrator, is tuned by the common supply rail voltage $V_{dda}$. As a generality this filter 88 comprises an arrangement of balanced class AB transconductors, capacitors and MOS resistors. The input to the filter 88 comprises a preamplifer PRA consisting of a single-ended transconductor having a shunt load resistor R1 coupled to its output. A post amplifier POA consisting of a single-ended transconductor and a shunt load resistor R2 constitutes an output stage of the filter 88. The resistors R1 and R2 may comprise common mode resistors. Also the filter and load resistors may comprise MOS resistors. The voltage $V_{dda}$ is derived from a tuning arrangement which comprises a primitive filter (or oscillator) arrangement 90 which uses the same transconductors and capacitors as the filter 88. The arrangement 90 is coupled to a voltage supply line $V_{dd}$ and has an input 92 for a reference clock, an output 94 for the voltage $V_{dda}$ and means for tuning to a frequency of a reference clock by adjustment of the common supply rail voltage $V_{dda}$. The voltage $V_{dda}$ on the output 94 is also used as the positive supply voltage for the filter 88 and for a MOS resistor tuning block 96. The MOS resistor tuning block 96 contains the same transconductors and MOS resistors, or scaled versions, as are used in the filter 88. In operation, the frequency tuning block 90 tunes the filter response by way of adjusting the voltage $V_{dda}$, which voltage is supplied to the MOS resistor tuning block 96 which simultaneously tunes the filter's and amplifiers' MOS resistors by way of the control voltage cntrl. Thus the control voltage cntrl can track changes in the tuning of the filter 88 using the voltage $V_{dda}$.

FIG. 8 illustrates an embodiment of the MOS resistor tuning block 96 for creating the tuning condition R=1/G. The block 96 comprises a single-ended transconductor 102 having its output 103 connected back to its input 104. The transconductor 102, which may be implemented as shown in FIG. 2, is powered by the voltage $V_{dda}$ and has a quiescent input voltage ($V_{cm}-\Delta V$) which is made lower than that of the main transconductors ($V_{cm}$) through appropriate sizing of its PMOS and NMOS transistors. The output 103 is also connected to an input node 106 of a parallel arrangement of a transconductor 108 having a transconductance −G and of the source-drain path of a NMOS transistor 110 which is operating in its triode region and emulates an MOS resistor. An output node 112 of the parallel arrangement is coupled to a non-inverting integrating stage 114, implemented as a Miller integrator and an inverting amplifier 120. The Miller integrator comprises a transconductor 116 having a transconductance −G. The transconductor 116 is connected to the supply rail $V_{dda}$ and has a feedback capacitor 118. An inverting amplifier 120 is coupled to an output of the transconductor 116. An output from the integrating stage 114 comprises the control voltage cntrl which is coupled by a line 122 to the gate electrode of the NMOS transistor 110 and to an output terminal 124 which is coupled to a resistor tuning control signal input 89 (FIG. 7) of the filter 88. The input 89 is coupled to the gate electrodes of the MOS resistors 84, 86 (FIG. 4) or to the gate electrode of MOS resistors used in other applications such as FIG. 6 or the preamplifier and postamplifier loads R1, R2 as shown in FIG. 7.

As mentioned above the transconductor 102 is similar to the single ended transconductor shown in FIG. 2 but its quiescent voltage is offset, for example lowered compared to that of the transcoductor 108, by changing the sizes of the NMOS and PMOS transistors by increasing $(W/L)_N$ and decreasing $(W/L)_P$. As an example in one known semiconductor process a normal transconductor used a $(W/L)_N$ =6.18/11.6 and $(W/L)_P$=12.28/5.8 and produced a nominal quiescent voltage of $V_{cm}$=0.531V whereas in the case of the transconductor 102 $(W/L)_N$ was increased by a factor 1.4 and $(W/P)_P$ was decreased by the same factor and produced an offset voltage $V_{cm}-\Delta V$=0.514V (so $\Delta V$=17 mV). The offset voltage ($V_{cm}-\Delta V$) is connected to the transconductor 108 and to the source of the MOS transistor 110. In the case of the transconductor 108 the offset voltage causes the transconductor 108 to be unbalanced and a current of $\Delta V.G$ flows from its output and into the input of the Miller integrator 114. As the integrator 114 has a high dc voltage gain with the result the offset voltage applied to the MOS resistor 110 causes a current of $-\Delta V/R$. This produces a net current flowing into the integrator 114 of I=$\Delta V(G-1/R)$ which makes the integrator ramp-up its output voltage. The output voltage is amplified by the inverter 116, which can be a simple logic inverter, and the voltage cntrl is generated and is connected back to the gate electrode of the MOS resistor 110. The loop stabilises with I=0 which occurs when R=1/G.

The cntrl voltage is applied by way of the terminal 124 to the gates of the filter's MOS resistors which in a balanced arrangement experience the same mean voltage $V_{cm}$ and so have the same, or scaled, values as the MOS resistor 110 in the control loop. Thus any changes in the common supply rail voltage $V_{dda}$ needed to stabilise the filter response through tuning of the transconductance G are compensated by loop action which adjusts cntrl to maintain I=0 and thereby make R=1/G. The high voltage gain of the integrator 114 and the amplifier 120 allows the tuning voltage cntrl on the line 122 to be developed with a small disturbance to the node 112, that is, the voltage at the node 112 is close to $V_{cm}$.

The magnitude of $\Delta V$ is not so important. As $\Delta V$ is applied to both the transconductor 108 and the MOS resistor 110 its magnitude does not affect the condition for I=0.$\Delta V$ will change with changes in the common supply rail voltage $V_{dda}$ while the loop is stabilizing and this does not matter either. However the value of $\Delta V$ should not be too low as it will give noise problems or so high as to cause stability problems.

The results of a control loop simulated in a current semiconductor process with the abovementioned transconductor designs and sizes and with a NMOS resistor 110 of W/L=2/7.3 operating from an external supply of $V_{dd}$=1.8V and a fixed analogue common supply rail voltage $V_{dda}$=1.138V are shown in the table set out below. Over the complete range of extreme process and temperature, it can be seen that G varies by nearly 75% but the conductance of the MOS resistor (1/R) tracks the transconductance G to within 1%.

|  | Slow 80 C. | Nominal 27 C. | Fast −20 C. |
| --- | --- | --- | --- |
| $V_{cntrl}$ | 1.702 V | 1.655 V | 1.623 V |
| $I_G$ | +525 μA | +631 μA | +812 μA |
| $I_R$ | −525 μA | −631 μA | −812 μA |
| G | 29.23 μS | 37.99 μS | 51.34 μS |
| 1/R | 28.93 μS | 37.82 μS | 51.25 μS |
| G · R | 1.010 | 1.004 | 1.002 |

An example of an electronic device comprising the balanced transconductor is shown in FIG. 10, which shows a block schematic diagram of a radio receiver 130. The radio receiver 130 has an input 132 coupled to receive a signal from an antenna 134. The received signal is filtered by an antenna filter 136 and then amplified in a low noise amplifier (LNA) 138 before being frequency down converted in mixers 140 to produce in-phase and quadrature phase IF signals I and Q. The I and Q signals are filtered by the electronic filter 142 and then digitized in analogue-to-digital converters (ADCs) 144 before being demodulated in a digital signal processor (DSP) 146 which provides a demodulated signal on an output 148.

In the drawings single-ended transconductors have been shown in the various control circuits but it is to be understood that balanced transconductors can be used.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of transconductor circuits and component parts therefor and which may be used instead of or in addition to features already described herein.

The invention claimed is:

1. A transconductor circuit comprising a transconductor (30, 35) coupled to a supply rail voltage source ($V_{dda}$) and at least one MOS resistor (R) comprising a MOS transistor (84, 86) whose source-drain path is coupled to the transconductor, resistance tuning means (96) coupled to the supply voltage rail and having an output for supplying a control voltage (cntrl) to a gate electrode of the MOS transistor, whereby the resistance value of the MOS resistor tracks changes in the transconductance of the transconductor due to tuning effected by altering the supply rail voltage ($V_{dda}$).

2. A transconductor circuit including a balanced transconductor comprising a first and a second single ended transconductors (30, 35), each having an input (40, 45) and an output (20, 25), MOS resistors respectively comprising MOS transistors (84, 86) having their source-drain paths coupled between respective first and second input terminals (10, 15) and the inputs (40, 45) of the first and second single ended transconductor (30, 35), a differential transconductance (200) coupled between the first and second input terminals (10, 15) and the inputs (40, 45) of the single ended transconductor (30, 35), a source of a common supply rail voltage ($V_{dda}$), and resistance tuning means (96) coupled to the common supply rail voltage source for supplying a control voltage (cntrl) to gate electrodes of the MOS transistors for tuning the resistance of the MOS resistors (84, 86).

3. A circuit as claimed in claim 1, characterized in that the or each MOS resistor comprises a NMOS transistor.

4. A filter circuit including a balanced transconductor comprising a first and a second single ended transconductor means (30, 35), each having an input (40, 45) and an output (20, 25), first and second MOS resistors respectively comprising first and second MOS transistors (84,86) having their source-drain paths coupled between respective first and second input terminals (10,15) and the inputs (40, 45) of the first and second single ended transconductor means (30, 35), a differential transconductance (200) coupled between the first and second input terminals (10, 15) and the inputs (40, 45) of the single ended transconductor means (30, 35), and a source of a common supply rail voltage ($V_{dda}$), frequency tuning means for tuning the filter by adjusting the common supply rail voltage and resistance tuning means (96) coupled to the common supply rail voltage source for supplying a control voltage (cntrl) to gate electrodes of the first and second MOS transistors for tuning the resistance of the MOS resistors (84, 86).

5. An integrated circuit having a transconductor circuit as claimed in claim 1.

6. An electronic device having a transconductor circuit as claimed in claim 1.

* * * * *